(12) United States Patent
Li et al.

(10) Patent No.: US 9,490,310 B2
(45) Date of Patent: Nov. 8, 2016

(54) MANUFACTURING METHOD AND STRUCTURE OF THIN FILM TRANSISTOR BACKPLANE

(71) Applicant: Shenzhen China Star Optoelectronics Technology Co., Ltd., Shenzhen, Guangdong (CN)

(72) Inventors: Wenhui Li, Guangdong (CN); Hejing Zhang, Guangdong (CN); Longqiang Shi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 237 days.

(21) Appl. No.: 14/381,945

(22) PCT Filed: Jul. 14, 2014

(86) PCT No.: PCT/CN2014/082123
§ 371 (c)(1),
(2) Date: Aug. 28, 2014

(87) PCT Pub. No.: WO2015/192417
PCT Pub. Date: Dec. 23, 2015

(65) Prior Publication Data
US 2016/0240599 A1  Aug. 18, 2016

(30) Foreign Application Priority Data
Jun. 20, 2014  (CN) .......................... 2014 1 0281406

(51) Int. Cl.
| | |
|---|---|
| *H01J 1/62* | (2006.01) |
| *H01L 27/32* | (2006.01) |
| *H01L 21/77* | (2006.01) |
| *H01L 27/12* | (2006.01) |
| *H01L 51/00* | (2006.01) |
| *H01L 51/56* | (2006.01) |
| *H01L 51/52* | (2006.01) |

(52) U.S. Cl.
CPC .......... *H01L 27/3262* (2013.01); *H01L 21/77* (2013.01); *H01L 27/12* (2013.01); *H01L 27/1225* (2013.01); *H01L 51/0023* (2013.01); *H01L 51/56* (2013.01); *H01L 27/1214* (2013.01); *H01L 51/5206* (2013.01); *H01L 2227/323* (2013.01)

(58) Field of Classification Search
CPC ....................... H01L 51/5237; H01L 27/3244
USPC .................................................. 313/512, 506
See application file for complete search history.

(56) References Cited

U.S. PATENT DOCUMENTS

2008/0121886 A1   5/2008  Shin

*Primary Examiner* — Vip Patel
(74) *Attorney, Agent, or Firm* — Andrew C. Cheng (57) ABSTRACT

The present invention provides a manufacture method of a thin film transistor backplane, comprising steps of: providing a substrate (20) with a gate (21), an insulation layer (22) and a semiconducting layer (23); sequentially forming a second metal layer, a reflecting electrode layer and a conductive oxide layer on the substrate (20); implementing one photolithographic process to the second metal layer, the reflecting electrode layer and the conductive oxide layer to pattern the second metal layer, the reflecting electrode layer and the conductive oxide layer for respectively forming a source/a drain (253), a reflecting electrode (252) and a pixel electrode (251), and the source/the drain (253) are connected to the semiconducting layer (23; forming a protective layer on the source/the drain (253), the reflecting electrode (252) and the pixel electrode (251; forming a flat and pixel defining layer (27) on the protective layer (26); forming a photospacer (28) on the flat and pixel defining layer (27).

11 Claims, 8 Drawing Sheets

MANUFACTURING METHOD AND STRUCTURE OF THIN FILM TRANSISTOR BACKPLANE

FIELD OF THE INVENTION

The present invention relates to a skill field of a flat panel display, and more particularly to a manufacture method and a structure of a thin film transistor backplane.

BACKGROUND OF THE INVENTION

A flat panel display possesses advantages of being ultra thin, power saved and radiation free. It has been widely utilized. A present flat panel display mainly comprises a LCD (Liquid Crystal Display) or an OLED (Organic Light Emitting Display).

An OLED possesses many outstanding properties of self-illumination, no requirement of backlight, high contrast, ultra-thin, wide view angle, fast response, applicability of flexible panel, wide range of working temperature, simpler structure and process. The OLED is considered as next generation flat panel display technology.

Generally, OLED comprises a substrate, ITO (Indium Tin Oxide) transparent anode located on the substrate, a Hole Injection Layer (HIL) located on the ITO transparent anode, a Hole Transporting Layer located on the Hole Injection Layer, an emitting material layer (EML) located on the Hole Transporting Layer, an Electron Transport Layer (ETL) located on the emitting material layer and a Cathode located on the Electron Injection Layer. For promoting the efficiency, the emitting material layer is generally applied with co-host system.

OLED can be categorized as PM-OLED (Passive matrix OLED) and AM-OLED (Active matrix OLED).

A thin film transistor (TFT) has been widely utilized as a switching element and a driving element in an electronic device. Specifically, with the possible formation of the thin film transistor on a glass substrate or a plastic substrate. Therefore, they are commonly employed in display field, including a LCD, an OLED, an EPD and etc.

Figure 1:
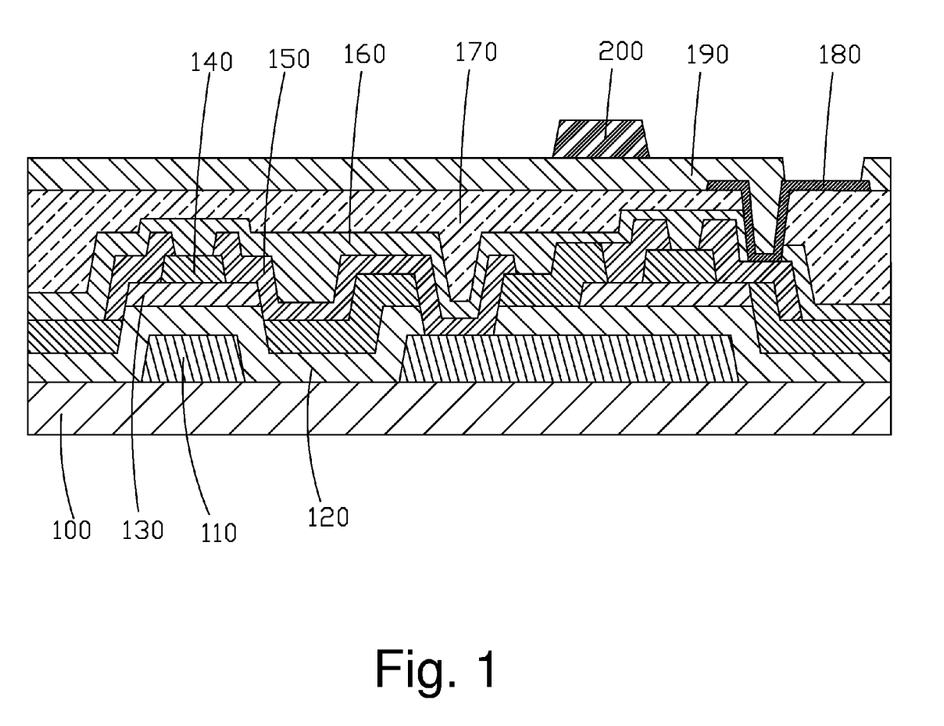
FIG. 1 is a diagram of a structure of a thin film transistor backplane in an AM-OLED according to prior art.

As shown in FIG. 1, which is a diagram of a structure of a thin film transistor backplane in an AM-OLED according to prior art, comprising a substrate 100, a gate 110, a gate insulation layer 120, a semiconducting layer 130, an etching stopper layer 140, a source/a drain 150, a protective layer 160, a flat layer 170, a pixel electrode 180, a pixel defining layer 190, a photospacer 200 and etc. The present manufacture method of a thin film transistor backplane in an AM-OLED is: respectively forming the gate 110, the gate insulation layer 120, the semiconducting layer 130, the etching stopper layer 140 with four photolithographic processes. Then, the source/the drain 150 are formed with one photolithographic process and then, the protective layer 160 and the flat layer 170 are formed. With another photolithographic process, the pixel electrode 180 is formed. At last, the pixel defining layer 190 and the photospacer 200 are formed. Certain disadvantages exist in the manufacture method of the thin film transistor backplane in the AM-OLED. Mainly, it can be understood that the formation of each layer requires one photolithographic process (Every photolithographic process comprises manufacture processes of thin film, photo, etching, stripping and etc.) The more the photolithographic process is required, the process time takes longer and the yield of the production becomes lower; with more numbers of processes, the more considerable accumulated yield problem is. In the mean time, the structure of the thin film transistor backplane manufactured according to the aforesaid present manufacture method of the thin film transistor backplane in the AM-OLED utilizes the pixel electrode 180 bridging the source/the drain 150, then the contact resistance exists which can cause influence to the efficiency of the AM-OLED. Besides, the overlap of the pixel electrode 180 bridging the source/the drain 150 will occupy an area of the partial pixel and cause the aperture ratio dropping.

SUMMARY OF THE INVENTION

An objective of the present invention is to provide a manufacture method of a thin film transistor backplane. The prosecution of the manufacture method is simple and one photolithographic process can be eliminated. Accordingly, the manufacture process can be shortened. The production efficiency can be raised and the yield of the production can be promoted.

Another objective of the present invention is to provide a structure of a thin film transistor backplane, capable of eliminating issues of the contact resistance due to bridging the pixel electrode to the source/the drain and the occupied area of the partial pixel. The efficiency of the AM-OLED is promoted. The aperture ratio is increased. Meanwhile, the manufacture process for the structure of TFT backplane is simple and the production efficiency is higher.

For realizing the aforesaid objective, the present invention provides a manufacture method of a thin film transistor backplane, comprising steps of:

step 1, providing a substrate with a gate, an insulation layer and a semiconducting layer;

step 2, sequentially forming a second metal layer, a reflecting electrode layer and a conductive oxide layer on the substrate;

step 3, implementing one photolithographic process to the second metal layer, the reflecting electrode layer and the conductive oxide layer to pattern the second metal layer, the reflecting electrode layer and the conductive oxide layer for respectively forming a source/a drain, a reflecting electrode and a pixel electrode, and the source/the drain are connected to the semiconducting layer;

step 4, forming a protective layer on the source/the drain, the reflecting electrode and the pixel electrode;

step 5, forming a flat and pixel defining layer on the protective layer;

step 6, forming a photospacer on the flat and pixel defining layer.

On the substrate provided in the first step, the gate on the substrate, the insulation layer on the gate, the semiconducting layer on the insulation layer and an etching stopper layer on the semiconducting layer are formed.

On the substrate provided in the first step, the gate on the substrate, the insulation layer on the gate and the semiconducting layer on the insulation layer are formed.

On the substrate provided in the first step, a buffer layer on the substrate, a semiconducting layer on the buffer layer, an insulation layer on the semiconducting layer, a gate on the insulation layer and a second insulation layer on the gate are formed.

In the manufacture method of the thin film transistor backplane, a material of the second metal layer is molybdenum or aluminum, and a material of the reflecting electrode layer is silver, and a material of the conductive oxide layer is indium tin oxide; a material of the protective layer, the flat and pixel defining layer is an organic material, an inorganic material or a mixed material of the organic material and the inorganic material; the semiconducting layer is an oxide semiconducting layer, an amorphous silicon semiconducting layer, a polysilicon semiconducting layer or an organic semiconducting layer.

The present invention further provides a structure of a thin film transistor backplane, comprising: a source/a drain, a reflecting electrode located on the source/the drain, a pixel electrode located on the reflecting electrode, a protective layer located on the pixel electrode, a flat and pixel defining layer located on the protective layer and a photospacer located on the flat and pixel defining layer.

The structure of the thin film transistor backplane further comprises a substrate, a gate on the substrate, an insulation layer on the gate, a semiconducting layer on the insulation layer and an etching stopper layer on the semiconducting layer; the source/the drain are connected to the semiconducting layer; the source/the drain are located on the etching stopper layer; the semiconducting layer is an oxide semiconducting layer, an amorphous silicon semiconducting layer, a polysilicon semiconducting layer or an organic semiconducting layer.

The structure of the thin film transistor backplane further comprises a substrate, a gate on the substrate, an insulation layer on the gate and a semiconducting layer on the insulation layer; the source/the drain are connected to the semiconducting layer; the source/the drain are located on the semiconducting layer; the semiconducting layer is an oxide semiconducting layer, an amorphous silicon semiconducting layer, a polysilicon semiconducting layer or an organic semiconducting layer.

The structure of the thin film transistor backplane further comprises a substrate, a buffer layer on the substrate, a semiconducting layer on the buffer layer, an insulation layer on the semiconducting layer, a gate on the insulation layer and a second insulation layer on the gate; the source/the drain are connected to the semiconducting layer; the source/the drain are located on the insulation layer; the semiconducting layer is an oxide semiconducting layer, an amorphous silicon semiconducting layer, a polysilicon semiconducting layer or an organic semiconducting layer.

A material of the source/the drain is molybdenum or aluminum, and a material of the reflecting electrode is silver, and a material of the pixel electrode is indium tin oxide; a material of the protective layer, the flat and pixel defining layer is an organic material, an inorganic material or a mixed material of the organic material and the inorganic material.

The present invention further provides a structure of a thin film transistor backplane, comprising: a source/a drain, a reflecting electrode located on the source/the drain, a pixel electrode located on the reflecting electrode, a protective layer located on the pixel electrode, a flat and pixel defining layer located on the protective layer and a photospacer located on the flat and pixel defining layer;

the structure of the thin film transistor backplane further comprises a substrate, a gate on the substrate, an insulation layer on the gate, a semiconducting layer on the insulation layer and an etching stopper layer on the semiconducting layer; the source/the drain are connected to the semiconducting layer; the source/the drain are located on the etching stopper layer; the semiconducting layer is an oxide semiconducting layer, an amorphous silicon semiconducting layer, a polysilicon semiconducting layer or an organic semiconducting layer;

wherein a material of the source/the drain is molybdenum or aluminum, and a material of the reflecting electrode is silver, and a material of the pixel electrode is indium tin oxide; a material of the protective layer, the flat and pixel defining layer is an organic material, an inorganic material or a mixed material of the organic material and the inorganic material.

The benefits of the present invention are: in the manufacture method of a thin film transistor backplane according to the present invention, by forming the second metal layer, the reflecting electrode layer and the conductive oxide layer in succession, only one photolithographic process is implemented to pattern the second metal layer, the reflecting electrode layer and the conductive oxide layer for respectively forming a source/a drain, a reflecting electrode and a pixel electrode. The number of photolithographic process is reduced. Accordingly, the manufacture process can be shortened. The production efficiency can be raised and the yield of the production can be promoted. Moreover, the prosecution of the manufacture method is simple. In the structure of the thin film transistor backplane according to the present invention, by locating the reflecting electrode on the source/the drain, and locating the pixel electrode on the reflecting electrode, the issues of the contact resistance due to bridging the pixel electrode to the source/the drain and the occupied area of the partial pixel are eliminated. The efficiency of the AM-OLED is promoted. The aperture ratio is increased. Meanwhile, the manufacture process for the structure of TFT backplane is simple and the production efficiency is higher.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Figure 2:
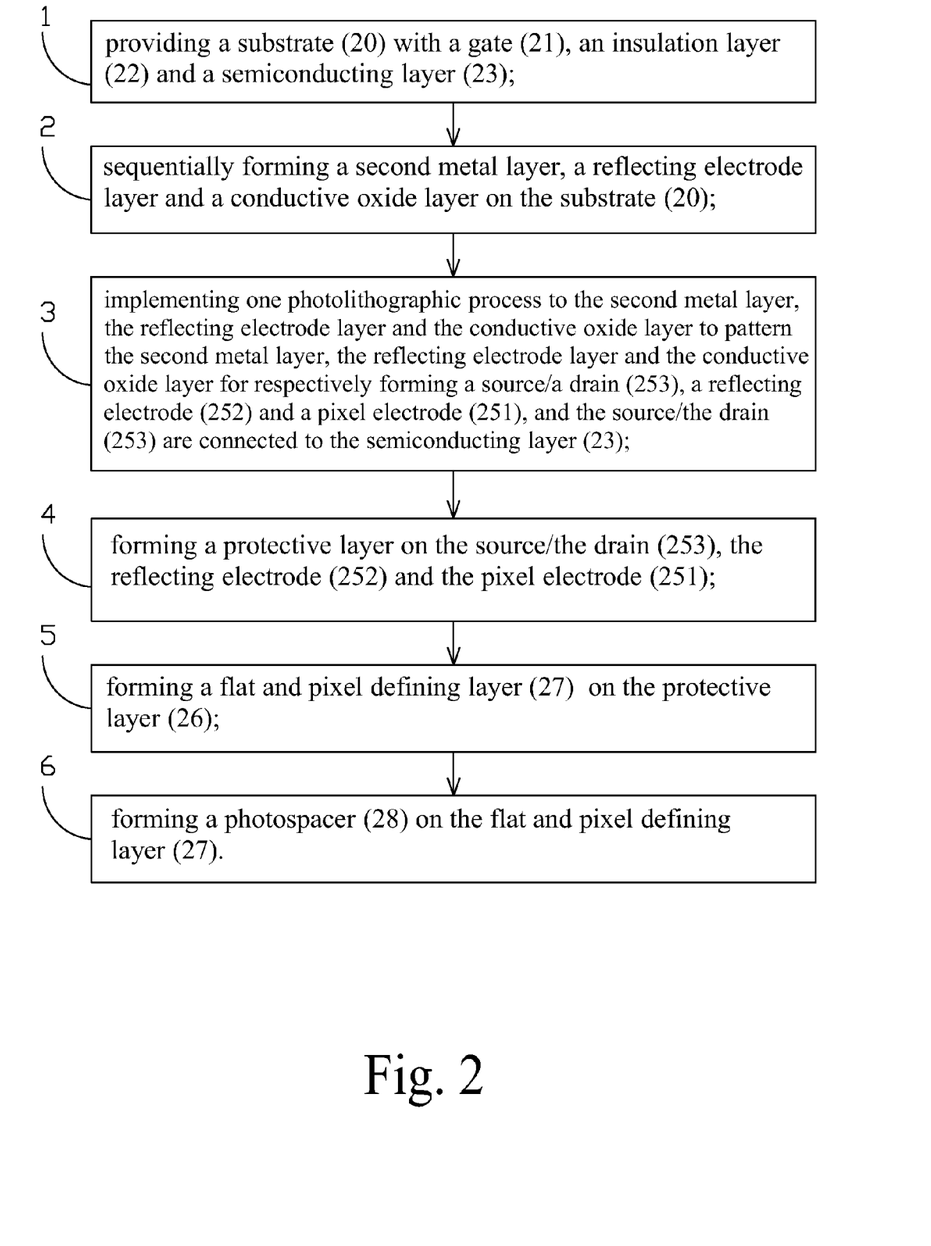
FIG. 2 is a flowchart of a manufacture method of a thin film transistor backplane according to the present invention.
Figure 3:
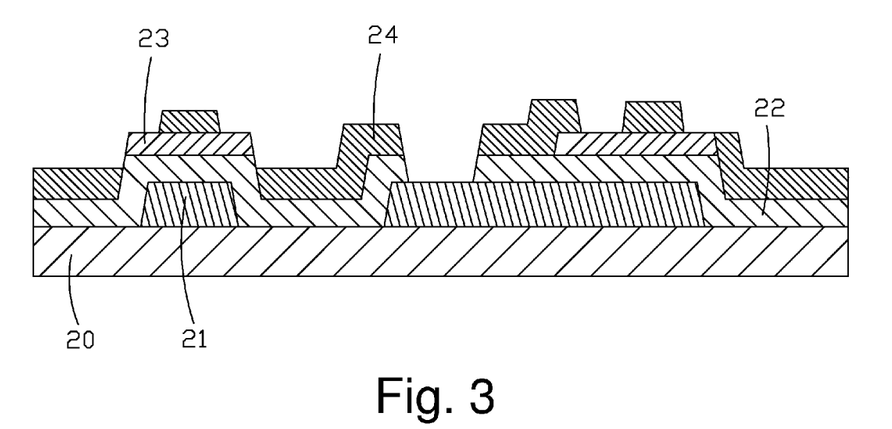
FIG. 3 is a diagram of the step 1 of the first embodiment of the manufacture method of the thin film transistor backplane according to the present invention.

Please refer to FIG. 2, which is a flowchart of a manufacture method of a thin film transistor backplane according to the present invention. Meanwhile, please refer from FIG. 3 to FIG. 7, which are diagrams of the first embodiment of the manufacture method of the thin film transistor backplane according to the present invention. The first embodiment is applicable to a bottom gate type thin film transistor backplane with an etching stopper layer. The manufacture method comprises:

step 1, providing a substrate 20 with a gate 21, an insulation layer 22 and a semiconducting layer 23;

The step 1 can be achieved by present skills. In step 1 of the first embodiment, the substrate 20 is a transparent substrate. Preferably, the substrate 20 is a glass substrate. On the substrate 20, the gate 21 on the substrate 20, the insulation layer 22 on the gate 21, the semiconducting layer 23 on the insulation layer 22 and an etching stopper layer 24 on the semiconducting layer 23 are formed. The gate 21, the insulation layer 22, the semiconducting layer 23 and the etching stopper layer 24 are sequentially formed on the substrate 20 with respective photolithographic process.

Figure 4:
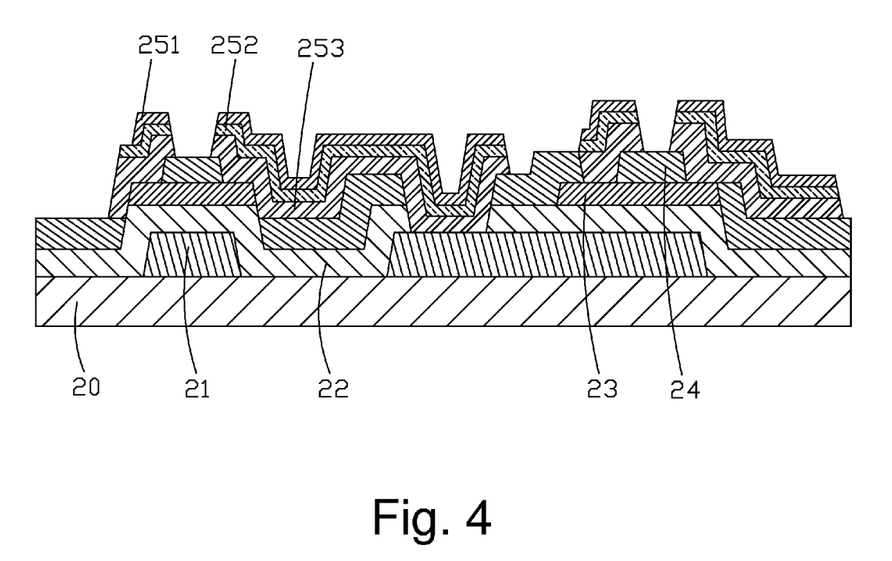
FIG. 4 is a diagram of the step 3 of the first embodiment of the manufacture method of the thin film transistor backplane according to the present invention.
Figure 5:
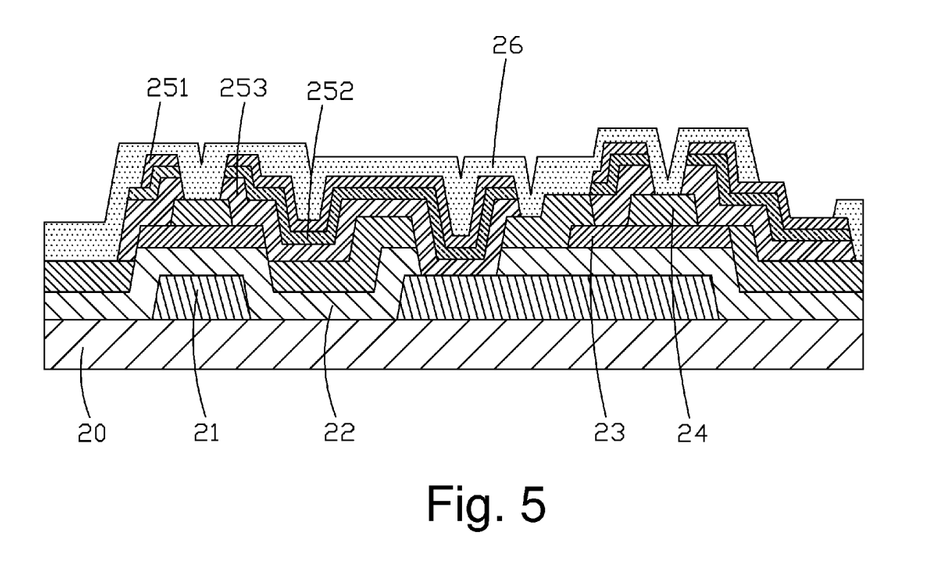
FIG. 5 is a diagram of the step 4 of the first embodiment of the manufacture method of the thin film transistor backplane according to the present invention.
Figure 6:
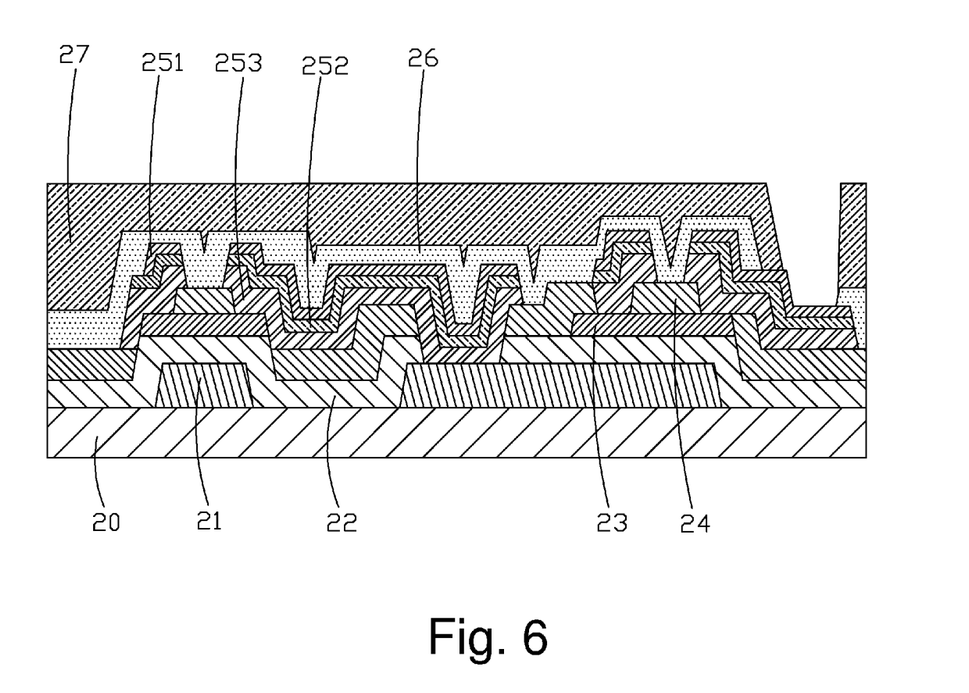
FIG. 6 is a diagram of the step 5 of the first embodiment of the manufacture method of the thin film transistor backplane according to the present invention.
Figure 7:
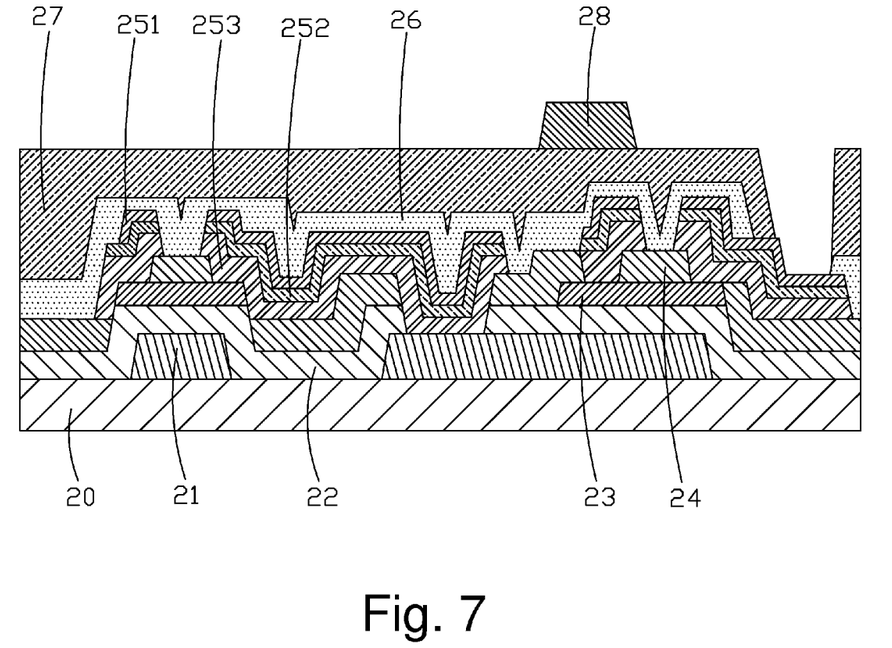
FIG. 7 is a diagram of the step 6 of the first embodiment of the manufacture method of the thin film transistor backplane according to the present invention, which is also a sectional diagram of the first embodiment of the structure of the thin film transistor backplane according to the present invention.

The semiconducting layer 23 can be an oxide semiconducting layer, such as an indium gallium zinc oxide semiconducting layer (IGZO), or an amorphous silicon (a-Si) semiconducting layer, a polysilicon (p-Si) semiconducting layer or an organic semiconducting layer.

step 2, sequentially forming a second metal layer, a reflecting electrode layer and a conductive oxide layer on the substrate 20;

Specifically, a material of the second metal layer is molybdenum (Mo) or aluminum (Al), and a material of the reflecting electrode layer is silver (Ag), and a material of the conductive oxide layer is indium tin oxide (ITO).

step 3, implementing one photolithographic process to the second metal layer, the reflecting electrode layer and the conductive oxide layer to pattern the second metal layer, the reflecting electrode layer and the conductive oxide layer for respectively forming a source/a drain 253, a reflecting electrode 252 and a pixel electrode 251, and the source/the drain 253 are connected to the semiconducting layer 23;

In step 3, only one photolithographic process is implemented to form the source/the drain 253, the reflecting electrode 252 and the pixel electrode 251. Comparing with the manufacture method of the thin film transistor backplane according to prior art, one photolithographic process merely for forming the pixel electrode can be eliminated. The manufacture process of the thin film transistor backplane can be shortened.

step 4, forming a protective layer on the source/the drain 253, the reflecting electrode 252 and the pixel electrode 251;

Specifically, a material of the protective layer 26 is an organic material, an inorganic material or a mixed material of the organic material and the inorganic material.

step 5, forming a flat and pixel defining layer 27 on the protective layer 26;

Specifically, a material of the flat and pixel defining layer 27 is an organic material, an inorganic material or a mixed material of the organic material and the inorganic material.

step 6, forming a photospacer 28 on the flat and pixel defining layer 27.

Figure 8:
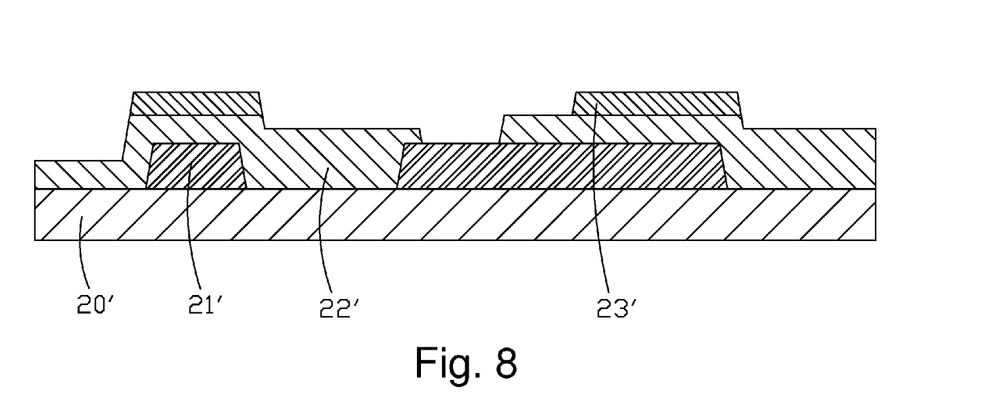
FIG. 8 is a diagram of the step 1 of the second embodiment of the manufacture method of the thin film transistor backplane according to the present invention.
Figure 9:
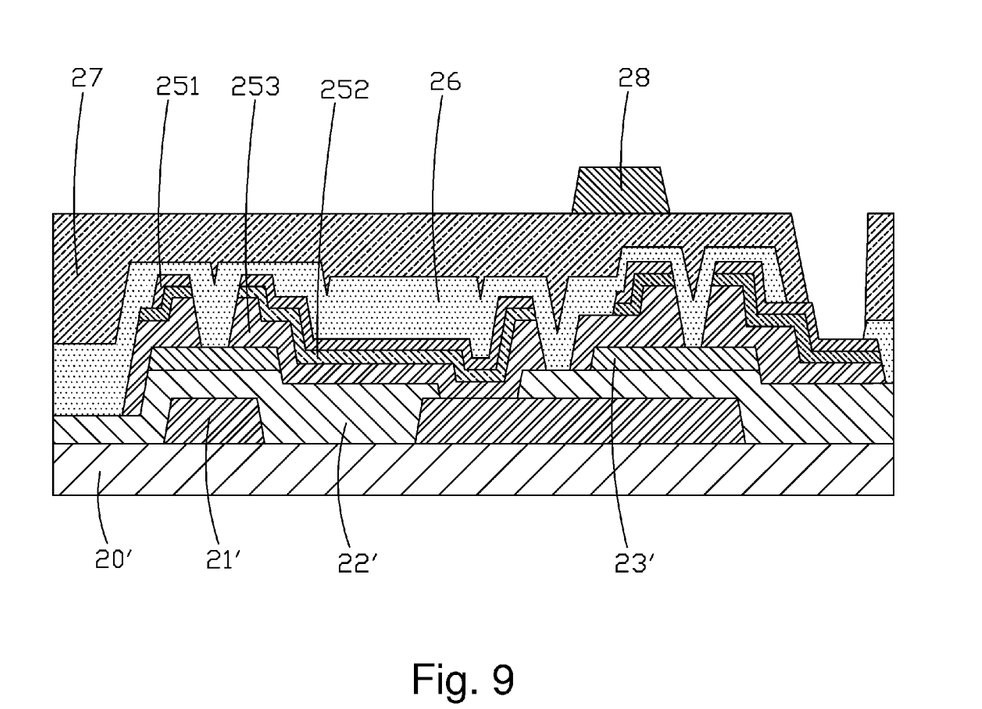
FIG. 9 is a diagram of the step 6 of the second embodiment of the manufacture method of the thin film transistor backplane according to the present invention, which is also a sectional diagram of the second embodiment of the structure of the thin film transistor backplane according to the present invention.

Please refer to FIG. 8 and FIG. 9, which are diagrams of the second embodiment of the manufacture method of the thin film transistor backplane according to the present invention. The second embodiment is applicable to a bottom gate type thin film transistor backplane without an etching stopper layer. The differences of the second embodiment from the first embodiment are:

step 1, providing a substrate 20' with a gate 21', an insulation layer 22' and a semiconducting layer 23';

In step 1 of the second embodiment, the substrate 20' is a transparent substrate. Preferably, the substrate 20' is a glass substrate. On the substrate 20', the gate 21' on the substrate 20', the insulation layer 22' on the gate 21' and the semiconducting layer 23' on the insulation layer 22' are formed. The gate 21', the insulation layer 22' and the semiconducting layer 23' are sequentially formed on the substrate 20' with respective photolithographic process.

The semiconducting layer 23' can be an oxide semiconducting layer, such as an indium gallium zinc oxide semiconducting layer (IGZO), or an amorphous silicon (a-Si) semiconducting layer, a polysilicon (p-Si) semiconducting layer or an organic semiconducting layer.

Other steps are the same as those described in the first embodiment. The repeated explanation is omitted here.

Figure 10:
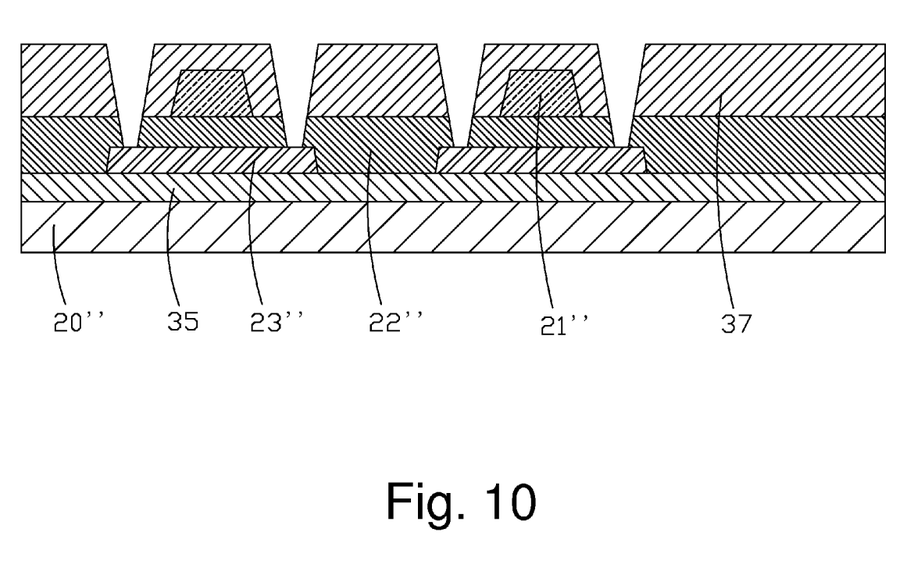
FIG. 10 is a diagram of the step 1 of the third embodiment of the manufacture method of the thin film transistor backplane according to the present invention.
Figure 11:
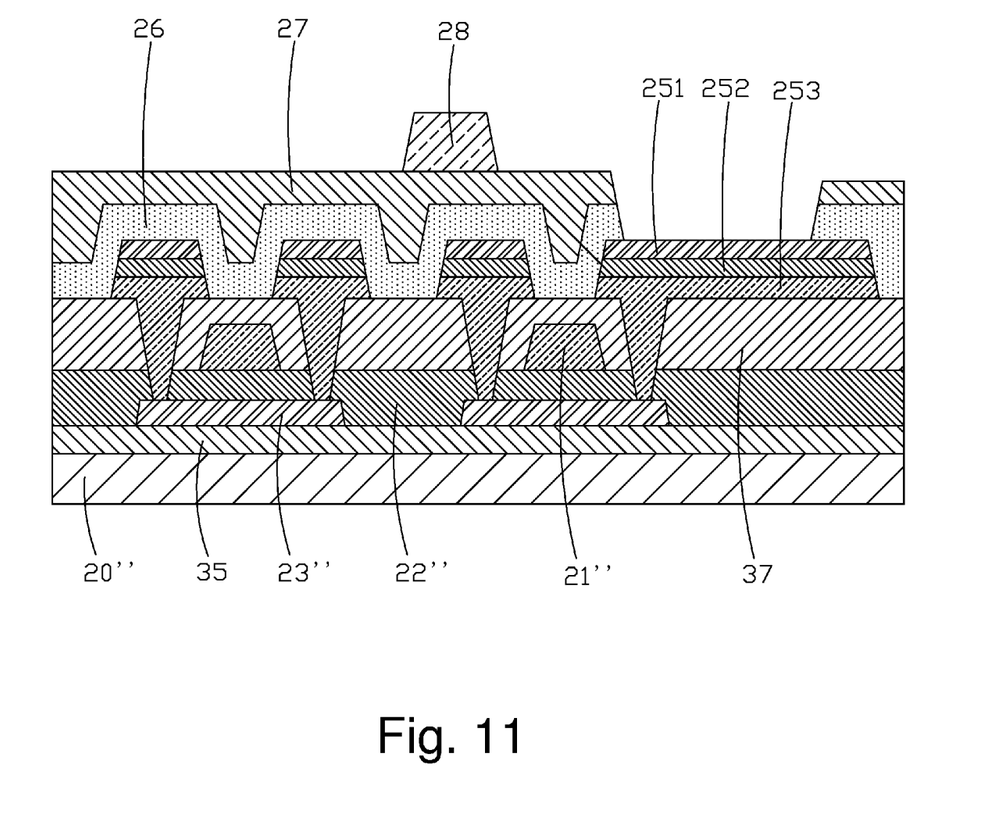
FIG. 11 is a diagram of the step 6 of the third embodiment of the manufacture method of the thin film transistor backplane according to the present invention, which is also a sectional diagram of the third embodiment of the structure of the thin film transistor backplane according to the present invention.

Please refer to FIG. 10 and FIG. 11, which are diagrams of the third embodiment of the manufacture method of the thin film transistor backplane according to the present invention. The third embodiment is applicable to a top gate type thin film transistor backplane. The differences of the third embodiment from the first and embodiments are:

step 1, providing a substrate 20" with a gate 21", an insulation layer 22" and a semiconducting layer 23";

In step 1 of the third embodiment, the substrate 20" is a transparent substrate. Preferably, the substrate 20" is a glass substrate. On the substrate 20", a buffer layer 35 on the substrate 20", a semiconducting layer 23" on the buffer layer 35, an insulation layer 22" on the semiconducting layer 23", a gate 21" on the insulation layer 22" and a second insulation layer 37 on the gate 21" are formed. The buffer layer 35, the semiconducting layer 23", the insulation layer 22", the gate 21" and the second insulation layer 37 are sequentially formed on the substrate 20".

The semiconducting layer 23" can be an oxide semiconducting layer, such as an indium gallium zinc oxide semiconducting layer (IGZO), or an amorphous silicon (a-Si) semiconducting layer, a polysilicon (p-Si) semiconducting layer or an organic semiconducting layer.

Other steps are the same as those described in the first embodiment. The repeated explanation is omitted here.

The present invention further provides a structure of a thin film transistor backplane. Please refer to FIG. 7 which is a sectional diagram of the first embodiment of the structure of the thin film transistor backplane according to the present invention. The first embodiment is a bottom gate type structure of a thin film transistor backplane with an etching stopper layer. The structure of the thin film transistor backplane according to the present invention comprises: a source/a drain 253, a reflecting electrode 252 located on the source/the drain 253, a pixel electrode 251 located on the reflecting electrode 252, a protective layer 26 located on the pixel electrode 251, a flat and pixel defining layer 27 located on the protective layer 26 and a photospacer 28 located on the flat and pixel defining layer 27. Specifically, the source/the drain 253, the reflecting electrode 252 and the pixel electrode 251 are sequentially formed in succession and then formed by one photolithographic process. The locations of the source/the drain 253, the reflecting electrode 252 and the pixel electrode 251 eliminate the issues of the contact resistance due to bridging the pixel electrode to the source/the drain and the occupied area of the partial pixel.

A material of the source/the drain 253 is molybdenum (Mo) or aluminum (Al), and a material of the reflecting electrode 252 is silver (Ag), and a material of the pixel electrode 251 is indium tin oxide (ITO); a material of the protective layer 26, the flat and pixel defining layer 27 is an organic material, an inorganic material or a mixed material of the organic material and the inorganic material.

The structure of the thin film transistor backplane further comprises a substrate 20, a gate 21 on the substrate 20, an insulation layer 22 on the gate 21, a semiconducting layer 23 on the insulation layer 22 and an etching stopper layer 24 on the semiconducting layer 23, and the source/the drain 253 are connected to the semiconducting layer 23; the source/the drain 253 are located on the etching stopper layer 24. The semiconducting layer 23 can be an oxide semiconducting layer, such as an indium gallium zinc oxide semiconducting layer (IGZO), or an amorphous silicon (a-Si) semiconducting layer, a polysilicon (p-Si) semiconducting layer or an organic semiconducting layer.

Please refer to FIG. 9, which is a sectional diagram of the second embodiment of the structure of the thin film transistor backplane according to the present invention. The second embodiment is a bottom gate type thin film transistor backplane without an etching stopper layer. The differences from the first embodiment are, the structure of the thin film transistor backplane further comprises a substrate 20', a gate 21' on the substrate 20', an insulation layer 22' on the gate 21' and a semiconducting layer on the insulation layer; the source/the drain 253' are connected to the semiconducting layer 23'; the source/the drain 253' are located on the semiconducting layer 23'. The semiconducting layer 23' can be an oxide semiconducting layer, such as an indium gallium zinc oxide semiconducting layer (IGZO), or an amorphous silicon (a-Si) semiconducting layer, a polysilicon (p-Si) semiconducting layer or an organic semiconducting layer.

The others of the structure are the same as those described in the first embodiment. The repeated explanation is omitted here.

Please refer to FIG. 11, which is a sectional diagram of the third embodiment of the structure of the thin film transistor backplane according to the present invention. The third embodiment is a top gate type thin film transistor backplane. The differences of the third embodiment from the first and embodiments are, the structure of the thin film transistor backplane further comprises a substrate 20", a buffer layer 35 on the substrate 20", a semiconducting layer 23" on the buffer layer 35, an insulation layer 22" on the semiconducting layer 23", a gate 21" on the insulation layer 22" and a second insulation layer 37 on the gate 21"; the source/the drain 253" are connected to the semiconducting layer 23"; the source/the drain 253" are located on the second insulation layer 37. The semiconducting layer 23" can be an oxide semiconducting layer, such as an indium gallium zinc oxide semiconducting layer (IGZO), or an amorphous silicon (a-Si) semiconducting layer, a polysilicon (p-Si) semiconducting layer or an organic semiconducting layer.

The others of the structure are the same as those described in the first embodiment. The repeated explanation is omitted here.

In conclusion, in the manufacture method of a thin film transistor backplane according to the present invention, by forming the second metal layer, the reflecting electrode layer and the conductive oxide layer in succession, only one photolithographic process is implemented to pattern the second metal layer, the reflecting electrode layer and the conductive oxide layer for respectively forming a source/a drain, a reflecting electrode and a pixel electrode. The number of photolithographic process is reduced. Accordingly, the manufacture process can be shortened. The production efficiency can be raised and the yield of the production can be promoted. Moreover, the prosecution of the manufacture method is simple. In the structure of the thin film transistor backplane according to the present invention, by locating the reflecting electrode on the source/the drain, and locating the pixel electrode on the reflecting electrode, the issues of the contact resistance due to bridging the pixel electrode to the source/the drain and the occupied area of the partial pixel are eliminated. The efficiency of the AM-OLED is promoted. The aperture ratio is increased. Meanwhile, the manufacture process for the structure of TFT backplane is simple and the production efficiency is higher.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A structure of a thin film transistor backplane, comprising: a source and a drain that, a reflecting electrode located on the source and the drain, a pixel electrode located on the reflecting electrode, a protective layer located on the pixel electrode, a flat and pixel defining layer located on the protective layer and a photospacer located on the flat and pixel defining layer, wherein the source and the drain, the reflecting electrode, and the pixel electrode are laminated on each other such that the reflecting electrode is directly interposed between the source and the drain and the pixel electrode.

2. The structure of the thin film transistor backplane according to claim 1, further comprising a substrate, a gate on the substrate, an insulation layer on the gate, a semiconducting layer on the insulation layer and an etching stopper layer on the semiconducting layer; wherein the source and the drain are connected to the semiconducting layer; the source and the drain are located on the etching stopper layer; and the semiconducting layer is one of an oxide semiconducting layer, an amorphous silicon semiconducting layer, a polysilicon semiconducting layer and an organic semiconducting layer.

3. The structure of the thin film transistor backplane according to claim 1, further comprising a substrate, a gate on the substrate, an insulation layer on the gate and a semiconducting layer on the insulation layer; wherein the source and the drain are connected to the semiconducting layer; the source and the drain are located on the semiconducting layer; and the semiconducting layer is one of an oxide semiconducting layer, an amorphous silicon semiconducting layer, a polysilicon semiconducting layer and an organic semiconducting layer.

4. The structure of the thin film transistor backplane according to claim 1, further comprising a substrate, a buffer layer on the substrate, a semiconducting layer on the buffer layer, an insulation layer on the semiconducting layer, a gate on the insulation layer and a second insulation layer on the gate; wherein the source and the drain are connected to the semiconducting layer; the source and the drain are located on the insulation layer; and the semiconducting layer is one of an oxide semiconducting layer, an amorphous silicon semiconducting layer, a polysilicon semiconducting layer and an organic semiconducting layer.

5. The structure of the thin film transistor backplane according to claim 1, wherein a material of the source and the drain is molybdenum or aluminum, and a material of the reflecting electrode is silver, and a material of the pixel electrode is indium tin oxide; a material of the protective layer and the flat and pixel defining layer is an organic material, an inorganic material or a mixed material of the organic material and the inorganic material.

6. A structure of a thin film transistor backplane, comprising: a source and a drain, a reflecting electrode located on the source and the drain, a pixel electrode located on the reflecting electrode, a protective layer located on the pixel electrode, a flat and pixel defining layer located on the protective layer and a photospacer located on the flat and pixel defining layer, wherein the source and the drain, the reflecting electrode, and the pixel electrode are laminated on each other such that the reflecting electrode is directly interposed between the source and the drain and the pixel electrode;

the structure of the thin film transistor backplane further comprises a substrate, a gate on the substrate, an insulation layer on the gate, a semiconducting layer on the insulation layer and an etching stopper layer on the semiconducting layer; wherein the source and the drain are connected to the semiconducting layer; the source and the drain are located on the etching stopper layer; and the semiconducting layer is one of an oxide semiconducting layer, an amorphous silicon semiconducting layer, a polysilicon semiconducting layer and an organic semiconducting layer;

wherein a material of the source and the drain is molybdenum or aluminum, and a material of the reflecting electrode is silver, and a material of the pixel electrode is indium tin oxide; a material of the protective layer and the flat and pixel defining layer is an organic material, an inorganic material or a mixed material of the organic material and the inorganic material.

7. A manufacture method of a thin film transistor backplane, comprising steps of:
step 1, providing a substrate with a gate, an insulation layer and a semiconducting layer;
step 2, sequentially forming a second metal layer, a reflecting electrode layer and a conductive oxide layer on the substrate such that the second metal layer, the reflecting electrode layer and the conductive oxide layer are laminated on each other;
step 3, implementing one photolithographic process to the second metal layer, the reflecting electrode layer and the conductive oxide layer to pattern the second metal layer, the reflecting electrode layer and the conductive oxide layer for respectively forming a source and a drain, a reflecting electrode and a pixel electrode, wherein the source and the drain are connected to the semiconducting layer;
step 4, forming a protective layer on the source/the drain, the reflecting electrode and the pixel electrode;
step 5, forming a flat and pixel defining layer on the protective layer; and
step 6, forming a photospacer on the flat and pixel defining layer.

8. The manufacture method of the thin film transistor backplane according to claim 7, wherein the gate on the substrate, the insulation layer on the gate, the semiconducting layer on the insulation layer and an etching stopper layer on the semiconducting layer are formed on the substrate provided in the first step.

9. The manufacture method of the thin film transistor backplane according to claim 7, wherein the gate on the substrate, the insulation layer on the gate and the semiconducting layer on the insulation layer are formed on the substrate provided in the first step.

10. The manufacture method of the thin film transistor backplane according to claim 7, wherein a buffer layer on the substrate, a semiconducting layer on the buffer layer, an insulation layer on the semiconducting layer, a gate on the insulation layer and a second insulation layer on the gate are formed on the substrate provided in the first step.

11. The manufacture method of the thin film transistor backplane according to claim 7, wherein a material of the second metal layer is molybdenum or aluminum, and a material of the reflecting electrode layer is silver, and a material of the conductive oxide layer is indium tin oxide; a material of the protective layer, the flat and pixel defining layer is an organic material, an inorganic material or a mixed material of the organic material and the inorganic material; the semiconducting layer is an oxide semiconducting layer, an amorphous silicon semiconducting layer, a polysilicon semiconducting layer or an organic semiconducting layer.

* * * * *